United States Patent
Chang

(10) Patent No.: US 7,639,071 B2
(45) Date of Patent: Dec. 29, 2009

(54) ACTIVE LC BAND PASS FILTER

(75) Inventor: Yun-O Chang, El Monte, CA (US)

(73) Assignee: Zyion, Inc., Monterey Park, CA (US)

( * ) Notice: Subject to any disclaimer, the term of this patent is extended or adjusted under 35 U.S.C. 154(b) by 376 days.

(21) Appl. No.: 11/570,123

(22) PCT Filed: Nov. 30, 2006

(86) PCT No.: PCT/US2006/061411

§ 371 (c)(1),
(2), (4) Date: Dec. 6, 2006

(87) PCT Pub. No.: WO2008/066552

PCT Pub. Date: Jun. 5, 2008

(65) Prior Publication Data

US 2008/0252366 A1 Oct. 16, 2008

(51) Int. Cl.
*H04B 1/10* (2006.01)
(52) U.S. Cl. .................. 327/557; 327/553
(58) Field of Classification Search ............ None
See application file for complete search history.

(56) References Cited

U.S. PATENT DOCUMENTS

| | | | | |
|---|---|---|---|---|
| 4,496,859 A | * | 1/1985 | Crooks | 327/556 |
| 4,659,995 A | * | 4/1987 | Feistel | 327/555 |
| 5,006,810 A | * | 4/1991 | Popescu | 327/552 |
| 5,038,328 A | | 8/1991 | Brunius | |
| 5,142,580 A | * | 8/1992 | Neil | 704/205 |
| 6,157,248 A | | 12/2000 | Minami et al. | |

FOREIGN PATENT DOCUMENTS

KR 1019990063245 A1 7/1999
WO 03023958 A1 3/2003

OTHER PUBLICATIONS

International Search Report and the Written Opinion of the International Searching Authority, or the Declaration; Oct. 25, 2007.
Written Opinion of the International Preliminary Examining Authority; Dec. 29, 2008.

* cited by examiner

*Primary Examiner*—Lincoln Donovan
*Assistant Examiner*—Terry L Englund
(74) *Attorney, Agent, or Firm*—Danton K. Mak; Sheldon Mak Rose & Anderson

(57) ABSTRACT

An active LC band pass filter 10 includes a single LC pair and a plurality of active amplifiers providing a number of separate resonance circuits. The active amplifiers compensate ohmic losses, high frequency skin effects, and high frequency radiation. Each circuit has a resonance frequency that is adjustable by changing only the parameters of one or more active amplifiers. The filter 10 has a very high adjustable quality value Q, very low shape factor S, a relatively high signal-to-noise ratio, and a very large voltage gain that increases with frequency. High frequency performance is not affected by the quality of the LC pair, being limited only by the high frequency performance of the amplifier components. Also disclosed is a method for processing an electronic signal using the active LC band pass filter 10.

26 Claims, 3 Drawing Sheets

ACTIVE LC BAND PASS FILTER

BACKGROUND OF THE INVENTION

The present invention relates to band pass filters, and more particularly to such filters adapted for wireless or wired transmitter and receiver applications.

Resonance characteristics of a passive LC serial/parallel band pass filters has been studied thoroughly and are well-known. In a wireless or wired transmitter and receiver, a passive LC band pass filter is often the preferred selective or tuning amplifier unit (single or dual tuning) and is used widely thanks to its low price, operational stability, simple design, ease of frequency changing and superior performance. However, the Q value of the loop will decrease as the operating frequency increases. With increased frequency, the capacitor will consume ohms and distribute inductance in addition to its capacitance characteristic while the inductor will consume ohms and distribute capacitance apart from its inductance characteristic. Such consumption of ohms will increase when the operating frequency increases so that the ohm loss of the loop increases, leading to degradation in the quality of the loop. Due to such imperfections, a passive LC band pass filter is rarely used directly as a tuning amplifier unit at the pre-stage of a high-frequency receiving device with variable frequency for the purpose of improving the signal-to-noise ratio, sensitivity and selectivity of the receiving device. It is because of these shortcomings that wireless receiving devices adopt a superheterodyne mode, i.e., mixing, intermediate frequency amplification, wave detection, low frequency amplification and power amplification and place the majority of the amplification required by the receiving device on the intermediate frequency amplification where frequency is fixed, and the minority of the amplification on the subsequent low frequency amplification.

A passive LC serial band pass filter is often used at the pre-stage of a high frequency receiver with small source resistance. Generally, it is a single-tuning resonance system and requires, when working under high frequency, an inductor that has a high quality factor, i.e. an inductor made of silver-coated hollow conducting wire. Even so, the system will still have a relative high shape factor. A passive LC parallel band pass filter is widely used in low frequency signal transmitting and detecting devices with relatively low working frequency and large source resistance in radio engineering, acoustical engineering and mechanical vibration applications.

There have been many studies on active RC high pass filters, low pass filters and band pass filters made of passive R and C elements as well as operational amplifiers by using Fourier transformations and from the perspective of the frequency domain of a network. There also have been many studies on band pass filters made of high and low pass filters. However, change of resonance frequency of these band pass filters requires simultaneous, synchronous and precise change of the value of the parameters of several R and C elements, making change of frequency extremely complicated and difficult, particularly for high-performance band pass filters using multiple dual tuning units connected in series. Therefore, this type of active RC band pass filters is almost limited to use in receiving systems of fixed frequency only. Few studies, however, have been made on an active LC resonance and related theories and patents are rarely seen. Data show that up to date, there is no patent on an active LC band pass filter.

Typically, a receiving system for variable frequencies uses a heterodyne receiver. Currently in a heterodyne wireless receiving system, the high-frequency gain is relatively small. In order to meet the gain requirements for the whole system, the prevailing practice is to put the gain task on the intermediate frequency amplifier which can work stably at fixed frequency. In order to improve the sensitivity of the whole system, common practice is to rely on a large antenna or by using an additional antenna amplifier, or in a technically complicated scenario, using a dual tuning band pass filter made of two electric tuning diodes with variable capacitance at the pre-stage of the input to amplify the high frequency component at small powers.

Thus there is a need, particularly in the field of both wired and wireless receiving systems, for a high-performance input unit that is capable of high voltage gain, good selectivity, powerful noise suppression, high SNR, ease of input/output matching and stable operation to replace the existing passive LC band pass filter. In addition, the replacement should be very simple and can be made very easily. The input unit should work very stably.

SUMMARY OF INVENTION

The present invention meets this need by providing an active LC band pass filter that is particularly suitable for use as an input unit of a receiving device. The unit easily provides changes to resonance frequency and can be conveniently integrated in a receiving device.

In one aspect of the invention, an active LC band pass filter includes an LC pair being an inductor connected to a capacitor for resonance; a plurality of active amplifiers; the amplifiers being connected in combination with the LC pair to form at least one resonance circuit; and a plurality of adjustable resistive elements, each fed by one of the plurality of amplifiers for changing a gain, a resonance frequency, and/or a shape factor of the filter without changing the inductance or capacitance of the LC pair. Preferably ohmic losses of the LC pair and resonance energy loss from high frequency radiation are compensated by the active amplifiers. At least one of the adjustable resistive elements can include a potentiometer. Preferably a current limiting resistor is connected in series between one of the amplifiers and a corresponding one of the adjustable resistive elements. Preferably the amplifiers form a plurality of separate resonance circuits using only a solitary LC pair for ease of manufacture and control.

Preferably the separate resonance circuits are capable of resonance at different predetermined independent frequencies for facilitating formation of a desired frequency response characteristic. The different frequencies can be added at the LC pair, the filter further including an operational amplifier (arithmetic amplifier having high input impedance and low output impedance) connected to the LC pair for feeding a next stage circuit. The plurality of resonance circuits are capable of resonance at closely spaced frequencies for forming a single peak total frequency response curve. Advantageously, the upper frequency is limited only by cut-off frequencies of the active amplifiers. The passband can be adapted for use in a wideband communication receiving unit and/or a spread spectrum communication receiving unit having multiple sub-channels. This also permits the active LC band pass filter of the present invention to be substituted for a passive LC filter.

The LC pair is connected in series, or parallel. The band pass filter can be capable of single resonance, double resonance, and multiple resonance. Preferably the band pass filter has a circuit output voltage amplification that increases with a working frequency of the filter.

In one particular implementation, the band pass filter has a voltage gain G of at least 2000, a quality factor Q of at least 200, and a shape factor S of not greater than 10.

The active LC band pass filter can be incorporated in a receiving system.

In another aspect of the invention, an active LC band pass filter includes an LC pair being an inductor connected to a capacitor for resonance; a plurality of active amplifiers; the amplifiers being connected in combination with the LC pair to form at least one resonance circuit; and means for changing a gain, a resonance frequency, and/or a shape factor of the filter without changing the inductance or capacitance of the LC pair. Preferably, ohmic losses of the LC pair and resonance energy loss from high frequency radiation are compensated by the active amplifiers. The means for changing can include a potentiometer. Alternatively, or in addition, at least one of the active amplifiers can include an active circuit element, and the means for changing including a different active circuit element connected in place of it.

In another aspect of the present invention, a method for processing an electronic signal includes the steps of providing an active LC band pass filter including an LC pair being an inductor connected to a capacitor for resonance at a main resonant frequency, a plurality of active amplifiers, and the amplifiers being connected in combination with the LC pair to form at least one resonance loop, the resonance loop incorporating at least one resistive element; feeding the band pass filter with the electronic signal; extracting an output signal from the band pass filter; and adjusting the resistive element for altering a frequency response characteristic of the band pass filter, thereby correspondingly altering the output signal. The electronic signal can be a radio signal having a plurality of frequency channels within a frequency band, and the step of adjusting can be effective for selecting a particular one of the channels. The band pass filter can be operational at a first working frequency, the method comprising the further step of changing the capacitor for operating the band pass filter at a different working frequency.

In a further aspect of the invention, a method for processing an electronic signal includes the steps of:

(a) defining a circuit configuration for an active LC band pass filter, the circuit including an LC pair being an inductor connected to a capacitor for resonance at a main resonant frequency, a plurality of active amplifiers, and the amplifiers being connected in combination with the LC pair to form at least one resonance loop, the resonance loop incorporating at least one resistive element;

(b) for each resonance loop, forming a characteristic equation of a constant coefficient liner non-homogeneous ordinary differential equation describing the band pass filter, identifying two characteristic roots of the differential equation in the form $$-[F_1] \pm \sqrt{F_1^2 - 4\frac{F_2 - 1}{F_3 CL}},$$

and selecting circuit parameters such that $F_2$ is not less than unity and for a desired frequency of the eigen solution $$\omega_0 = \sqrt{F_1^2 - 4\frac{F_2 - 1}{F_3 CL}};$$

(c) constructing the circuit;

(d) feeding the band pass filter with the electronic signal; and (e) extracting an output signal from the band pass filter. The method can include the further step of adjusting the resistive element for altering a frequency response characteristic of the hand pass filter, thereby correspondingly altering the output signal.

DRAWINGS

These and other features, aspects, and advantages of the present invention will become better understood with reference to the following description, appended claims, and accompanying drawings, where:

DETAILED DESCRIPTION

The present invention is directed to a band pass filter comprising active components, L, and C elements, denoted herein as an active L (inductance) C (capacitance) band pass filter, and more particularly to an active LC band pass filter, which, under high frequency, improves the Q value (quality factor), selectivity (i.e. shape factor) and voltage gain of a loop, and which uses an inductor-capacitor pair for the tuning of selected frequencies from single tuning, dual tuning to multiple tuning, and in which changes of tuning frequency can be made easily. The active LC band pass filter of the present invention has a high frequency performance that is no longer determined primarily by the parameters of the L and C elements but by the frequency characteristics of the amplifier component. The circuit can maintain superior performance as long as the amplifier is able to operate properly under the operating frequency.

The Underlying Technology and Theory:

The underlying theory of the active LC band pass filter of the present invention can be understood directly from the differential equation which has a very clear physical meaning and straightforwardly describes the physical process, rather than from the usual approach using the theory of frequency domain of a network. From this perspective, an inductor is a differential unit for current and a capacitor is an integral unit for voltage. A loop made of these two units is certainly described by a second-order linear constant coefficient ordinary differential equation system. A second-order linear constant coefficient ordinary differential equation has two types of solutions, i.e., stable solution and oscillatory solution. When used in an amplification system, the stable solution is the only desired solution as the oscillatory solution is undesirable. Solutions of a second-order linear constant coefficient ordinary differential equation are determined by the coefficients of the equation. General solutions of a second-order non-homogeneous equation can be determined jointly by a special solution of a non-homogeneous equation with excitation and the general solutions of a homogeneous equation. The frequency of resonance solution is also determined by the coefficients of the equation, but the coefficients can be determined arbitrarily. Therefore, the solutions of a differential equation can be controlled.

Figure 1:
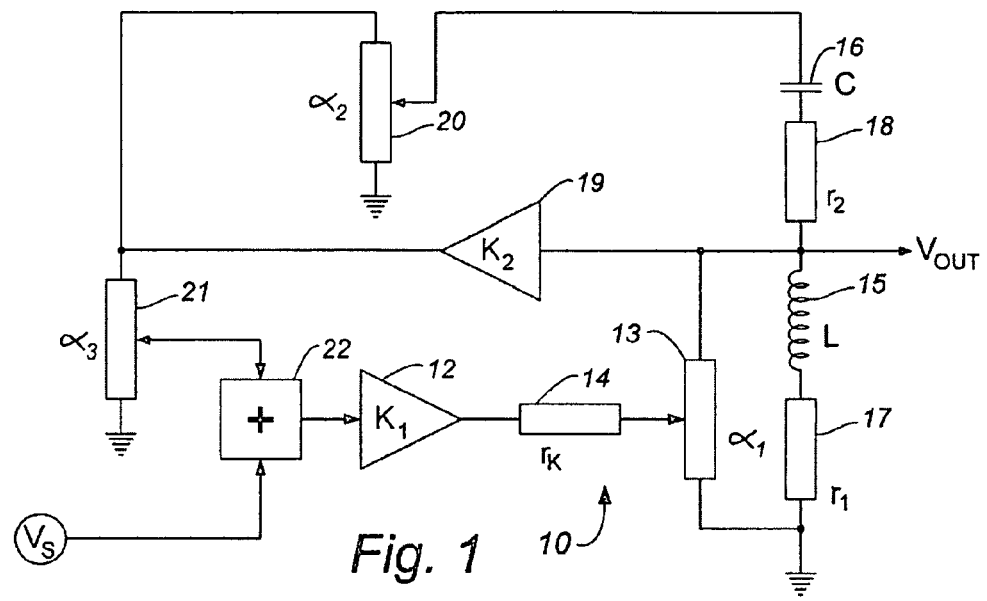
FIG. 1 is a circuit diagram of an active LC band pass filter according to the present invention.

According to the present invention, the solutions of a suitable equation are limited to within a range which is far away from resonance, enabling the amplification coefficient to filter and amplify stably under a specified frequency. With reference to FIG. 1 of the drawings, an active LC filter 10 includes a first amplifier 12 that is fed from a signal source $V_S$, the amplifier having a first amplifying power $K_1$ and feeding the wiper of a first potentiometer 13 having a first attenuation factor $\alpha_1$ (current attenuation) through a current limiting safeguard resistor 14. The filter 10 also includes an inductor 15 and series-connected capacitor 16, the inductor having an inductance L and an internal resistance $r_L$, the capacitor having a capacitance C and an internal resistance $r_C$ that is negligibly small. An external resistor 17 having a resistance $r_1$ is serially connected to the inductor 15, and another external resistor 18 having a resistance $r_2$ is serially connected to the capacitor 16. The first amplifier 12 drives the L and $r_1$ resonance circuit, also providing an output $V_{out}$ of the active LC filter 10. A counter electromotive force of the inductance L is fed from $V_{out}$ to a second amplifier 19 having a second amplifying power $K_2$ and feeding a second potentiometer 20 having a second attenuation factor $\alpha_2$ (voltage attenuation), the amplified signal passing through the capacitor 16 and entering the inductor 15. The voltage generated at the output $V_{out}$, amplified by the second amplifier 19, also feeds a third potentiometer 21, being attenuated by a third attenuation factor $\alpha_3$ (voltage attenuation) and additively combined with the input signal $V_S$ as indicated at 22. This component is further amplified by $K_1$ and attenuated by $\alpha_1$ as described above, being then output from the capacitor 16, flowing through the resistor $r_1$ which is the resistance connected in series with the inductor, the resistors $r_1$ and $r_2$ being current limiting and self-excitation suppression resistances. The following equation describes the active LC filter 10:

$$k_1\alpha_1 V_S + \alpha_2 k_2 CL \frac{d^2}{dt^2} V_{out} + \left(\frac{k_2\alpha_2 C}{r_1+r_L+r_C+r_2} - \frac{L}{r_1+r_L}\right)\frac{d}{dt}V_{out} + k_2k_1\alpha_1\alpha_3 L V_{out} = V_{out} \quad (0)$$

The first term at the left side of the equation is the input $V_S$, amplified by the first amplifier 12 as described above; the second term is the counter electromotive force; the third term is the voltage produced at the two resistances $r_L$ and $r_1$, after the current, which originates from the output $V_{out}$, is amplified by $K_2$ and attenuated by $\alpha_2$, and fed through the capacitor 16 as described above; and the fourth term is the voltage generated at the output when the current from the output $V_{out}$ and amplified by $K_2$, attenuated by $\alpha_3$, further amplified by $K_1$ and attenuated by $\alpha_1$, and then output from the capacitor 16, flows through the resistance $r_1$ which is the resistance of the inductor connected in series. From the above previously unknown equation, a second-order constant coefficient non-homogeneous ordinary differential equation of typical pattern can be obtained:

$$\alpha_2 k_2 CL \frac{d^2}{dt^2} V_{out} + \left(\frac{k_2\alpha_2 C}{r_1+r_L+r_C+r_2} - \frac{L}{r_1+r_L}\right) \quad (1)$$

-continued
$$\frac{d}{dt}V_{out} + [k_1\alpha_1\alpha_3 k_2 L - 1]V_{out} = -k_1\alpha_1 V_S$$

On the right side of the equation is an excitation source, i.e., the signal source $V_s$. The characteristic equation of this constant coefficient linear non-homogeneous ordinary differential equation is:

$$k_2\alpha_2 CLs + \left(\frac{k_2\alpha_2 C}{r_1+r_L+r_C+r_2} - \frac{L}{r_1+r_L}\right)s' + [k_1\alpha_1\alpha_3 k_2 L - 1]s = 0$$

The two characteristic roots are:

$$-\left(\frac{1}{(r_1+r_L+r_C+r_2)L} - \frac{1}{(r_1+r_L)k_2\alpha_2 C}\right) \pm \sqrt{\left(\frac{1}{(r_1+r_L+r_C+r_2)L} - \frac{1}{(r_1+r_L)k_2\alpha_2 C}\right)^2 - 4\frac{k_1\alpha_1\alpha_3 k_2 - 1}{k_2\alpha_2 CL}}$$

The general solutions of this linear non-homogeneous equation can be obtained very quickly. The attenuation factor is $$e^{-\left(\frac{1}{(r_1+r_L+r_C+r_2)L} - \frac{1}{(r_1+r_L)k_2\alpha_2 C}\right)t};$$

the solution is $$V_{out} = e^{-\left(\frac{1}{(r_1+r_L+r_C+r_2)L} - \frac{1}{(r_1+r_L)k_2\alpha_2 C}\right)t}[A\sin\omega_0 t + B\cos\omega_0 t]$$

The two specific constants, A and B, are determined by the initial conditions.

In the equation $$\omega_0 = \sqrt{\left(\frac{1}{(r_1+r_L+r_C+r_2)L} - \frac{1}{(r_1+r_L)k_2\alpha_2 C}\right)^2 - 4\frac{[k_1\alpha_1\alpha_3 k_2 - 1]}{k_2\alpha_2 CL}} \quad (2)$$

for the sine excitation function $V_s = V_0 \sin\omega_0 t$ to have a stable solution, the expression within the radical must be $\leq 0$. It is apparent that the capacitance C is at least two levels smaller than the inductance L. The condition $K_1\alpha_1 K_2\alpha_3 - 1 \geq 0$ can be made definitely tenable by adjusting the value of the amplifying power and that of the attenuation factor of the amplifier, i.e., $K_1$, $\alpha_1 K_2$, and $\alpha_3$. In this way, it can be ensured that the solution functions are also sine functions.

The variable constant method (also known as the specific coefficient method), a well-known method in differential equation mathematics, quickly yields the general solutions of the non-homogeneous equation:

$$V_{out} = A\sin\omega_0 t + B\cos\omega_0 t - \frac{k_1\alpha_1 V_0}{\omega_0 k_2\alpha_2 LC}\int_0^t \sin\omega\xi\sin\omega_0(t-\xi)d\xi$$

After merger, calculation and settlement, the special solution of the non homogeneous equation under zero initial conditions is finally expressed as follows:

$$V_{out} = \frac{k_1 \alpha_1 V_0}{2\omega_0 k_2 \alpha_2 LC} \frac{\sin\omega t}{(\omega - \omega_0)} \quad (3)$$

Other terms in the equation (not shown) cannot be detected as they are filtered out for too high frequency.

Under the action of a sine input signal, $V_0 \sin \omega t$, the output signal is in inverse proportion to the difference between the angular frequency $\omega$ of input signal, and the angular frequency of the equation's eigen solution, $\omega_o$, i.e., $\omega - \omega_o$, and also in inverse proportion to $\omega_0 LC$. This determines a very important feature of the present invention, that when the frequency difference is approaching a small value, the active LC band pass filter 10 has a very large output, and consequently a very high voltage amplifying power as well as a very high quality factor, Q.

The above shows the response of the exemplary active LC band pass filter 10 of FIG. 1 having only one resonance loop. When there are several resonance loops in a circuit, this rule of response applies to each loop in the circuit. Each resonance loop has a frequency corresponding to the parameters of that same loop. Such frequencies may be the same or different. When resonance frequencies of the resonance loops are different from each other, the output waveform of the circuit is the result of stacking all the waveforms of these different frequencies.

Additional active components can be utilized for adding a corresponding number of second-order loops to the LC band pass filter using the same LC pair. Also, there are a number of active element configurations available for forming series/parallel active LC filter circuits. The resonance frequency of a loop responding to a sine input is determined by equation (2) above. In the radical expression, the absolute value of the second term is larger than the first term, and the frequency of the output sine signal is primarily determined by the second term. Since other parameters including $K_1$, $\alpha_1$, $K_2$, $\alpha_2$, and $\alpha_3$ are far greater than L and C, the frequency is primarily determined by the values of L and C, but also is slightly affected by parameters including $K_1$, $\alpha_1$, $K_2$, $\alpha_2$, and $\alpha_3$. This is why the frequencies corresponding to individual resonance loops can be the same or different.

Figure 2:
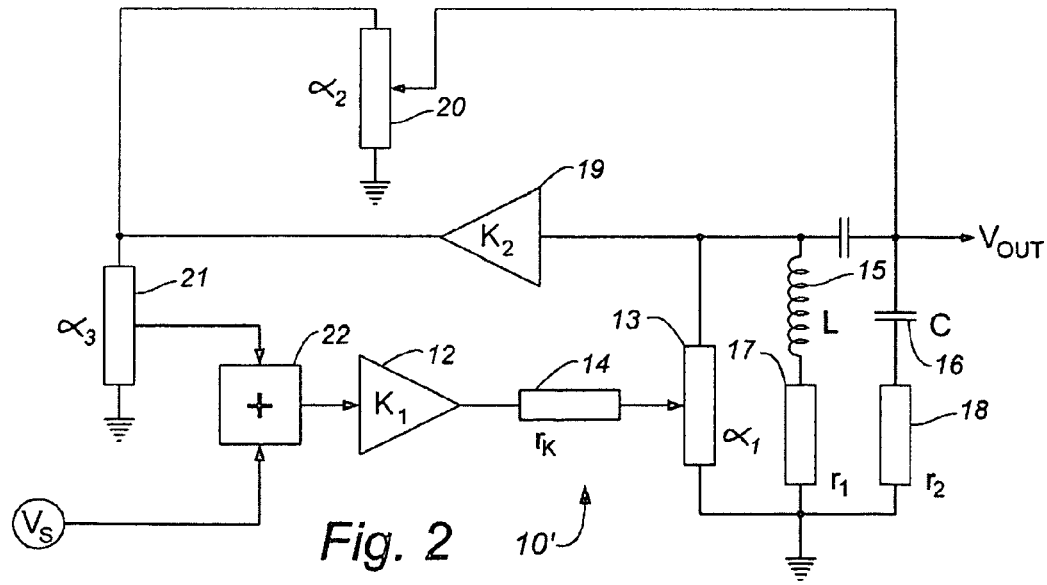
FIG. 2 is a circuit diagram showing an alternative configuration of the filter of FIG. 1.

The above is a theoretical analysis of a serial active LC filter as exemplified by the filter 10 of FIG. 1. With further reference to FIG. 2, another configuration of the present invention provides a parallel active LC band pass filter 10' that has typical application at lower frequencies. A differential equation corresponding to Equation (1) can be developed according to FIG. 2 based on the foregoing discussion and a corresponding theoretical analysis will be apparent to those skilled in the art. The active LC band pass filter of the present invention is disclosed with a focus on serial resonance and requires only a bar chart to illustrate the parallel resonance, whose working mechanism can be discussed by referencing the serial resonance.

Figure 4:
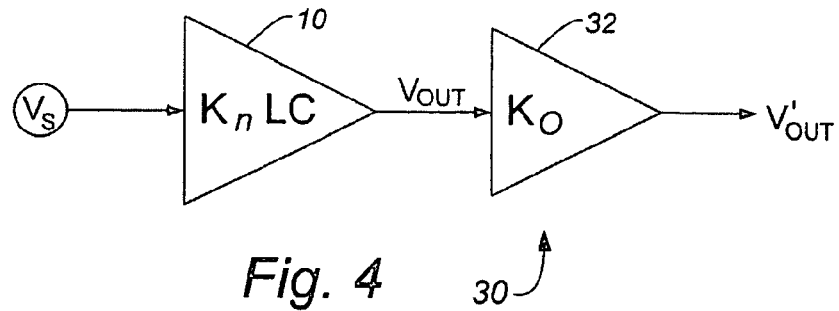
FIG. 4 is a circuit diagram showing the filter of FIG. 1 in combination with an operational amplifier.

With further reference to FIG. 4, an operational amplifier 32, having a gain $k_o$ can be connected to the LC pair ($V_{out}$) of the filter 10 of FIG. 1 (having a gain represented by $k_n LC$) for feeding a next stage circuit (not shown) with a signal $V'_{out}$.

Figure 5:
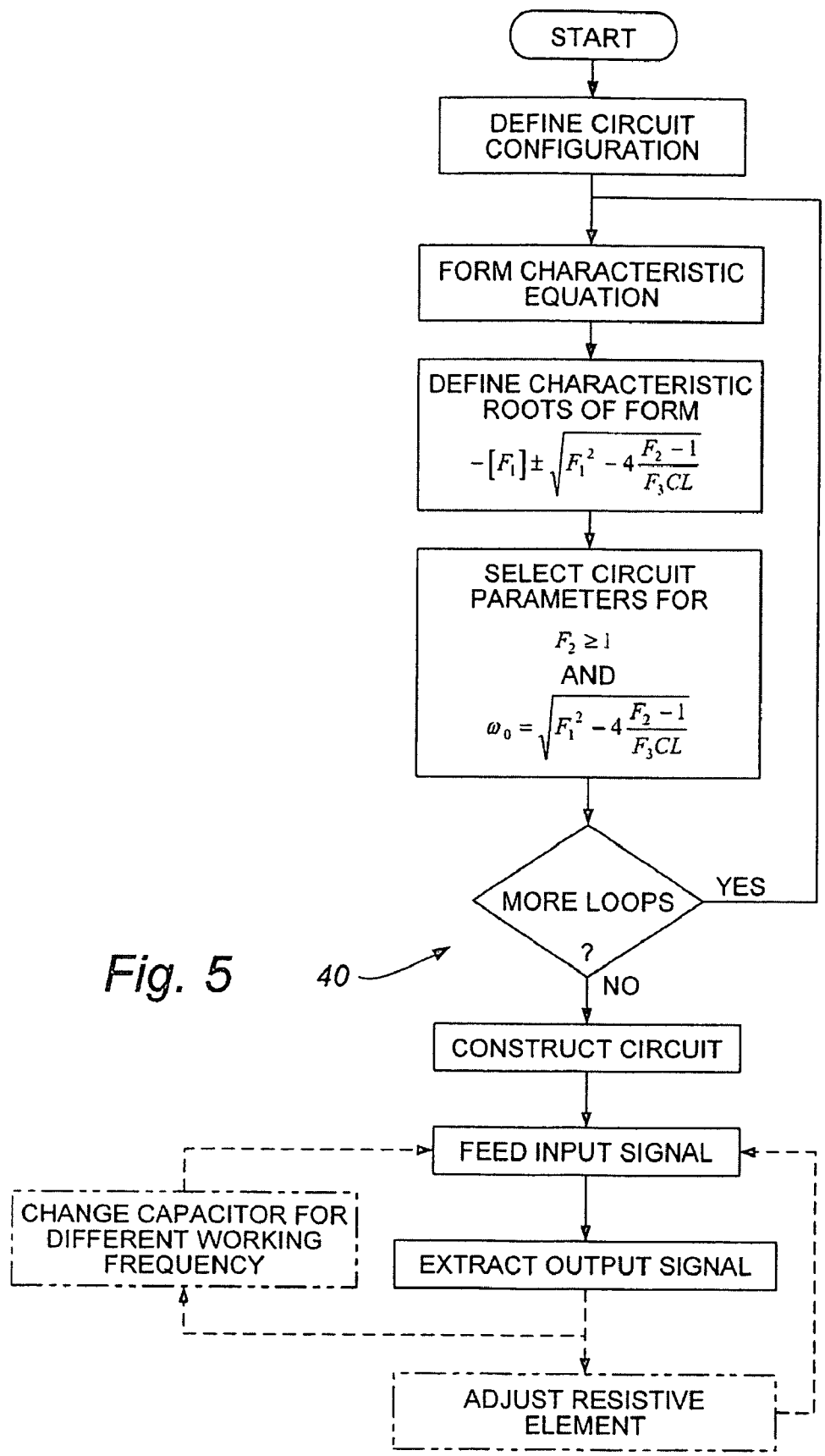
FIG. 5 is a flow chart of a method for processing an electronic signal using an active LC band pass filter according to the present invention.

With further reference to FIG. 5, the present invention thus provides a novel method 40 for processing an electronic signal, including the steps of:

(a) defining a circuit configuration for an active LC band pass filter, the circuit including an LC pair being an inductor connected to a capacitor for resonance at a main resonant frequency, a plurality of active amplifiers, and the amplifiers being connected in combination with the LC pair to form at least one resonance loop, the resonance loop incorporating at least one resistive element;

(b) for each resonance loop, forming a characteristic equation of a constant coefficient liner non-homogeneous ordinary differential equation describing the band pass filter, identifying two characteristic roots of the differential equation in the form $$-[F_1] \pm \sqrt{F_1^2 - 4\frac{F_2 - 1}{F_3 CL}},$$

and selecting circuit parameters such that $F_2$ is not less than unity and for a desired frequency of the eigen solution $$\omega_0 = \sqrt{F_1^2 - 4\frac{F_2 - 1}{F_3 CL}};$$

(c) constructing the circuit;
(d) feeding the band pass filter with the electronic signal; and
(e) extracting an output signal from the band pass filter. The method can include the further step of adjusting the resistive element for altering a frequency response characteristic of the band pass filter, thereby correspondingly altering the output signal. Additionally, or in the alternative, the method can include the further step of changing the capacitor for operating at a different working frequency.

Using active components for compensating the ohm loss of the loop can improve the Q value of a loop. It will be understood that overcompensation leads to self-activation of the loop, and the resistance of the inductor and that of the capacitor will no longer have a significant effect on the Q value of the resonance loop. Both theoretical analysis and experiment results prove this conclusion is correct. As can be seen in the theoretical analysis, a result of inserting active components into the resonance loop is that the resonance frequency of the loop is no longer determined only by the value of capacitor and inductor but is also affected by other elements in the loop. By adjusting the parameters of the other elements in the loop, the frequency of second-order non-homogeneous equation solutions can be changed without changing the inductance and capacitance values. Several different resonance frequencies can be obtained by using several different loops connected to the same inductor and capacitor pair. Therefore, using the same pair of L and C, an active LC band pass filter is capable of dual resonance and multiple resonance to reduce the shape factor S ($BW_{0.1}/BW_{0.7}$) to increase voltage gain and to improve selectivity of the receiving device.

Figure 3:
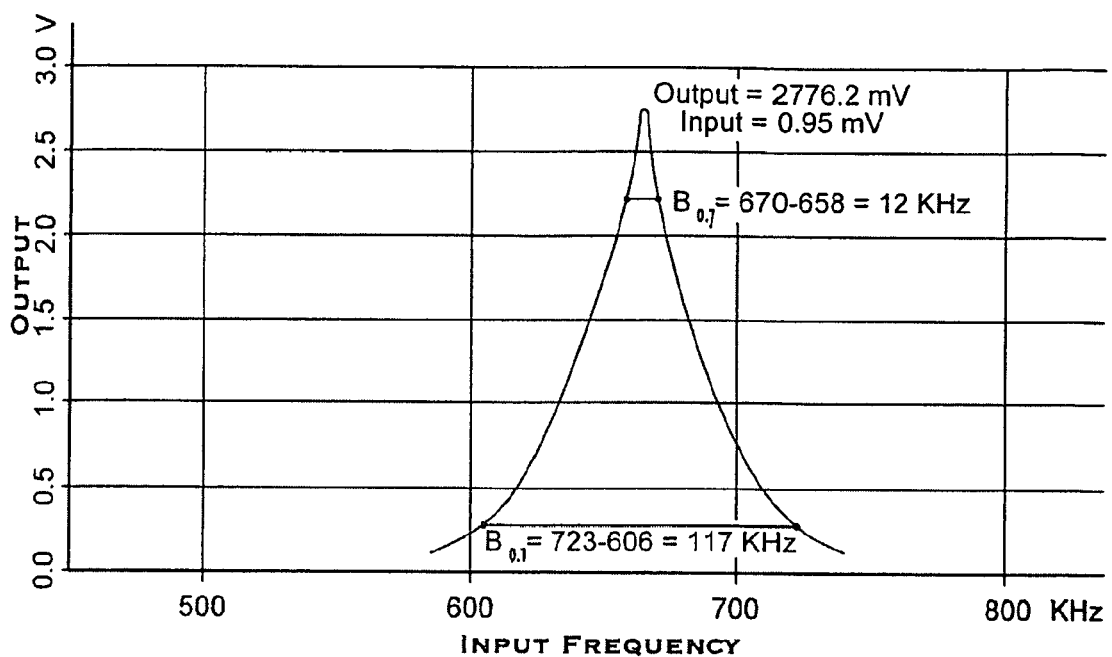
FIG. 3 is a frequency response plot of a test circuit having the configuration of FIG. 1.

From the technical perspective, experimental results support the above theoretical analysis. With further reference to FIG. 3, an exemplary frequency response curve showing dual resonance at a main frequency of 765 kHz by using an ordinary terylene capacitor connected in series with an ordinary hollow inductor made of a single strand of commercially available thin enameled copper wire. These were included as the inductor 15 (the inductance L being approximately 43 µH)

and capacitor 16 (the capacitance C being approximately 1 nF) in the circuit of FIG. 1, the first and second amplifiers 12 and 19 being FETs.

In the above-described experiment, the input was 0.95 mV and the output was 2776 mV. Therefore, the voltage amplifying power is 2922, i.e., the voltage gain is 69 dB. The measured bandwidth is $BW_{0.7}=12$ kHz at $-3$ dB and is $BW_{0.1}=117$ kHz at $-20$ dB. The loop has a quality factor of $Q=232$ and shape factor of $S=9.7$, which is very difficult to achieve with a single tuning loop made of a pair of passive L and C. From the round top of the frequency response curve, the difference from single tuning is apparent, as the frequency response curve of single tuning has a pointed top. Experimental data show that the quality factor of such a dual tuning loop, i.e., Q value of the loop, is preferably not too high, as this will increase the shape factor the loop. This is because in the active LC band pass filter of the present invention the inductor and capacitor themselves are no longer the deciding factors for the Q value of the loop. Unlike a passive LC filter, the resistance of the capacitor and inductor themselves and the resistance connected in series in the LC loop are no longer the only factors that determine the loop gain. The experimental data also show that the Q value of the loop should not be too low as this increases the shape factor of the loop. With LC values remaining unchanged, it is possible to easily change the Q value of the resonance loop in many ways. As shown in an experiment, if the Q value is blindly increased and the resonance frequency is adjusted to 1 MHz, the voltage amplifying power at the first stage can be over 73 dB but the shape factor exceeds 10. In fact, just one LC pair provides a multiple resonance system according to the present invention. Moreover, an active LC band pass filter of multiple resonances such made can have a voltage amplifying power of greater than 73 dB.

As shown in equation (3) above, the output voltage is in inverse proportion to the eigen frequency of the homogeneous equation and it slightly decreases when the input frequency increases. However, on one hand, a high output voltage is available even if $\omega_0(\omega-\omega_0)$ is very small. On the other hand, the output voltage can be increased by adjusting the value of $K_1$ and increasing the number of tuning loops, thus obtaining a large output voltage even at a very high frequency. The value of $k_1$ can be changed by substituting one or more different active elements in the first amplifier 12 and/or adjusting an included element such as a gain-changing potentiometer of the amplifier as is known by those skilled in electronic amplifier art.

Past experiments on passive single-tuning LC resonance loops show that the higher the Q values of the loops the narrower the bandwidth and in turn the larger amplifying power. However, when working at high frequency, a passive LC band pass filter will not be able to have a very high Q value as the loss of the resonance loop increases when the working frequency increases. Contrastingly, the active LC band pass filter of the present invention has a different nature due to the active components compensating the energy loss of the resonance loop, and the level of compensation is determined by parameters of a loop which are adjustable. In this way, the loss of the loop decreases and it is possible to have a very high gain even working at high frequencies. Of course, improving the Q value of the resonance loop should not be the single aim. All of the parameters including the Q value of the loop, the pass band width, the voltage amplifying power, and the shape factor should be taken into account. It is important that these parameters be balanced for optimal use of the system.

In a dual-resonance active band pass filter using a single pair of L and C, the two resonance loops use the same pair of inductor and capacitor as the coupling elements. Therefore, the coupling is a tight one and the resonance curve is unimodal. The above-described experimental data show that an active LC filter has much higher performance, much greater voltage gain and a smaller shape factor than a single-resonance passive LC filter.

The active LC filter of the present invention, when using the same pair of inductor and capacitor, can have multiple resonance loops, each of which can be tuned at a corresponding frequency and these frequencies are different from each other. Therefore, it is possible to have multi-channel tuning, that is, multiple tuning based on the same pair of capacitor and inductor. This is unachievable with prior passive LC resonance circuits.

Potential Application:

A resonance amplifying unit is a basic part of a signal processing system. The active LC band pass filter of the present invention has active components inserted so that the quality of the resonance loop is no longer lowered when the resonance frequency increases. Therefore, the active band pass filter amplifying unit of the present invention has wide application in various frequency bands ranging from very low frequency such as mechanical vibration to audio frequency to radio frequency. For example, it can be used in various sensors in the mechanical vibration spectrum for real-time analysis, and in ultrasound application systems for underwater detection applications. It can also be used in radio receiving systems to receive medium wave, short wave and ultrashort wave signals, and in mobile communications receiving systems as well as in TV receiving applications. An active LC band pass filter has selective voltage gain for input signals of different frequencies, and the gain reaches its maximum at resonance frequency. As can be seen from the above experimental results, the amplifying power quickly decreases on both sides of the resulting bell-shaped frequency response curve. The spectrum amplification of active band pass filters generally is not equal but weighted. At resonance frequency, the weight of amplification is maximal and the amplifying power is also maximal. Available measurement results show that the voltage amplifying power of an active LC dual tuning system may be greater than 60 dB. In case of resonance, the shape factor of the resonance curve can be 6-12 or even smaller. As the same pair of L and C is shared in such a resonance system as resonance elements, the two resonance loops are coupled very tightly and the frequency curve is round topped and unimodal. This allows direct replacememt of original (prior art) LC band pass input units in wired or wireless receiving systems to carry out weighted amplification of input signals of selected frequency with high amplifying power. Then a network of resistances or active components are used to compress in equal weight of power the signal output from the filter at the frequency spectrum and feed the compressed signal into a conversion stage for frequency conversion. The range of the signal output from the active LC band pass filter unit is quite wide, and this huge signal cannot be directly fed into a transistor frequency conversion stage. It is well known that if a signal fed into the transistor frequency stage is too large, the frequency conversion cannot be done properly. It will be understood that this is not applicable where an analog multiplier is used but the cost will significantly increase. The subsequent superheterodyne receiving layout of the receiving system remains unchanged. Since the network of attenuating resistances or attenuators of the active components provides equally weighted attenuation of input signals for each individual frequency so that the signal on both sides of the resonance curve decreases dramatically, so that the shape factor of the resonance loop is reduced. Therefore, this system provides significantly improved sensitivity and selectivity of the receiving system, reduces noise interference and improves the SNR of output signal.

It is evident that the resonance unit made of the active LC filter of the present invention can be directly used to replace the original passive LC resonance unit in the input unit of a superheterodyne receiving system. This simple replacement can significantly improve the receiving sensitivity and selectivity as well as SNR of the receiving system without changing the original layout of the superheterodyne receiving system. The receiving sensitivity of a receiving system depends only on the SNR of the system, which is mainly determined by the performance of the receiving system at the previous stage. Amplifications at subsequent stages after the first stage amplifying unit do not have much effect on improvement of the SNR of the first stage unit. This simple modification will dramatically improve the receiving performance of a superheterodyne receiving system. Of course, other types of wireless communication mobile phones can also use the active LC resonator as a high-frequency amplifying unit to be connected immediately following the antenna for significantly increasing receiving sensitivity, narrowing the distance between network stations and reducing the number of network stations. All of these are most simple, convenient, direct applications where best results can be achieved most easily.

Naturally, as with existing dual tuning, capacitance or mutual inductance can couple the resonance loops of two independent band pass filter units of active single tuning or active dual or multiple tuning made of two pairs of inductors and capacitors to reduce the degree of coupling between the two so that a flat-topped (critical coupling) or bimodal (loose coupling) resonance curve can be obtained. This further reduces the shape factor and increase the voltage gain. According to current experimental results, this system has a much higher performance than a passive dual tuning system. Use of an intermediate frequency amplifier made of such active band pass filters provides a much higher voltage gain than a typical intermediate frequency amplifier currently in use. This is probably the direction of future improvements in the performance of wired and wireless receiving systems.

By changing the coefficient before the first-order derivative of a second order differential equation, transitions between stable and oscillatory solutions can be achieved easily and quickly. The experimental results support this theoretical result. It is a circuit that advantageously provides both amplification and oscillation in a single type of circuit.

Although the present invention has been described in considerable detail with reference to certain preferred versions thereof, other versions are possible. Therefore, the spirit and scope of the appended claims should not necessarily be limited to the description of the preferred versions contained herein.

What is claimed is:

1. An active LC band pass filter comprising:
   (a) an LC pair being an inductor connected to a capacitor for resonance;
   (b) a plurality of active amplifiers;
   (c) the amplifiers being connected in combination with the LC pair to form at least one resonance circuit;
   (d) a plurality of adjustable resistive elements, each being fed by at least one corresponding amplifier of the amplifiers for changing a gain, a resonance frequency, and/or a shape factor of the filter without changing inductance or capacitance elements of the filter; and
   (e) a first resistor connected in series with the inductor and a second resistor connected in series with the capacitor for suppressing self-excitation of the filter.

2. The band pass filter of claim 1, wherein ohmic losses of the LC pair and resonance energy loss from high frequency radiation are compensated by the active amplifiers.

3. The band pass filter of claim 1, wherein at least one of the adjustable resistive elements comprises a potentiometer.

4. The band pass filter of claim 1, wherein the inductor and the capacitor within the LC pair are connected in series with respect to each other.

5. The band pass filter of claim 1, wherein the inductor and the capacitor within the LC pair are connected in parallel with respect to each other.

6. The band pass filter of claim 1, capable of single resonance, double resonance, and multiple resonance.

7. The band pass filter of claim 1, having a circuit output voltage amplification at the LC pair that increases with a working frequency of the filter.

8. A receiving system comprising the band pass filter of claim 1.

9. An active LC band pass filter comprising:
   (a) an LC pair being an inductor connected to a capacitor for resonance;
   (b) a plurality of active amplifiers;
   (c) the amplifiers being connected in combination with the LC pair to form at least one resonance circuit;
   (d) a plurality of adjustable resistive elements, each being fed by at least one corresponding amplifier of the amplifiers for changing a gain, a resonance frequency, and/or a shape factor of the filter without changing inductance or capacitance elements of the filter; and
   (e) a current limiting resistor connected in series between one of the adjustable resistive elements and one of the at least one corresponding amplifier.

10. An active LC band pass filter comprising:
    (a) an LC pair being an inductor connected to a capacitor for resonance;
    (b) a plurality of active amplifiers;
    (c) the amplifiers being connected in combination with the LC pair to form at least one resonance circuit;
    (d) a plurality of adjustable resistive elements, each being fed by at least one corresponding amplifier of the amplifiers for changing a gain, a resonance frequency, and/or a shape factor of the filter without changing inductance or capacitance elements of the filter, wherein the amplifiers form a plurality of separate resonance circuits using only the LC pair.

11. The band pass filter of claim 10, wherein the separate resonance circuits are capable of resonance at different predetermined independent frequencies.

12. The band pass filter of claim 11, wherein the different frequencies are added at the LC pair, the filter further comprising an operational amplifier connected to the LC pair for feeding a next stage circuit.

13. The band pass filter of claim 10, wherein the plurality of resonance circuits are capable of resonance at closely spaced frequencies for forming a single peak frequency response curve.

14. The band pass filter of claim 10, having a passband adapted for use in a wideband communication receiving unit.

15. The band pass filter of claim 10, having a passband adapted for use in a spread spectrum communication receiving unit having multiple sub-channels.

16. An active LC band pass filter comprising:
    (a) an LC pair being an inductor connected to a capacitor for resonance;

(b) a plurality of active amplifiers;
(c) the amplifiers being connected in combination with the LC pair to form at least one resonance circuit; and
(d) a plurality of adjustable resistive elements, each being fed by at least one corresponding amplifier of the amplifiers for changing a gain, a resonance frequency, and/or a shape factor of the filter without changing inductance or capacitance elements of the filter, wherein the filter has a voltage gain G of at least 2000, a quality factor Q of at least 200, and a shape factor S of not greater than 10.

17. An active LC band pass filter comprising:
(a) an LC pair being an inductor connected to a capacitor for resonance;
(b) a plurality of active amplifiers;
(c) the amplifiers being connected in combination with the LC pair to form at least one resonance circuit; and
(d) means for changing a resonance frequency of the filter without changing inductance or capacitance elements of the filter, wherein the amplifiers form a plurality of separate resonance circuits using only the LC pair.

18. The band pass filter of claim 17, wherein ohmic losses of the LC pair and resonance energy loss from high frequency radiation are compensated by the active amplifiers.

19. The band pass filter of claim 17, wherein the means for changing comprises a potentiometer.

20. The band pass filter of claim 17, wherein at least one of the active amplifiers comprises an active circuit element, and the means for changing comprises a different active circuit element connected in place thereof.

21. A method for processing an electronic signal, comprising the steps of:
(a) providing an active LC band pass filter comprising:
  (i) an LC pair being an inductor connected to a capacitor for resonance at a main resonant frequency;
  (ii) a plurality of active amplifiers; and
  (iii) the amplifiers being connected in combination with the LC pair to form a plurality of resonance loops using only the LC pair, each resonance loop incorporating at least one resistive element;
(b) feeding the band pass filter with the electronic signal;
(c) extracting an output signal from the band pass filter; and
(d) adjusting the at least one resistive element of at least one of the resonance loops for altering a frequency response characteristic of the band pass filter, thereby correspondingly altering the output signal.

22. The method of claim 21, wherein the electronic signal is a radio signal having a plurality of frequency channels within a frequency band, and the adjusting is effective for selecting a particular one of the channels.

23. The method of claim 21, wherein the band pass filter is operational at a first working frequency, the method comprising the further step of changing the capacitor for operating the band pass filter at a different working frequency.

24. A method for processing an electronic signal, comprising the steps of:
(a) defining a circuit configuration for an active LC band pass filter comprising:
  (i) an LC pair being an inductor connected to a capacitor for resonance at a main resonant frequency;
  (ii) a plurality of active amplifiers; and
  (iii) the amplifiers being connected in combination with the LC pair to form a plurality of resonance loops using only the LC pair, each resonance loop incorporating at least one resistive element;
(b) for each resonance loop:
  (i) forming a characteristic equation of a constant coefficient linear non-homogeneous ordinary differential equation describing the band pass filter;
  (ii) identifying two characteristic roots of the differential equation in the form $$-[F_1] \pm \sqrt{F_1^2 - 4\frac{F_2 - 1}{F_3 CL}} \, ,$$

wherein the characteristic roots are expressed as a negative term ($F_1$) plus or minus a radical containing $F_1$ squared and a fraction having a constant ($F_2$) minus unity in its numerator and another constant ($F_3$) multiplied by L and C in its denominator; and
  (iii) selecting circuit parameters such that $F_2$ is not less than unity and for a desired frequency of the eigen solution $$\omega_0 = \sqrt{F_1^2 - 4\frac{F_2 - 1}{F_3 CL}} \, ;$$

(c) constructing the circuit;
(d) feeding the band pass filter with the electronic signal; and
(e) extracting an output signal from the band pass filter.

25. The method of claim 24, comprising the further step of adjusting at least one of the resistive elements for altering a frequency response characteristic of the band pass filter, thereby correspondingly altering the output signal.

26. The method of claim 25, wherein the electronic signal is a radio signal having a plurality of frequency channels within a frequency band, and the adjusting is effective for selecting a particular one of the channels.

* * * * *